US009850909B2

(12) United States Patent
Roby et al.

(10) Patent No.: US 9,850,909 B2
(45) Date of Patent: Dec. 26, 2017

(54) HYBRID FAN DRIVE WITH ELECTRIC MOTOR

(75) Inventors: Joshua L. Roby, Battle Creek, MI (US); Thomas Buchholz, Stockach (DE)

(73) Assignee: BorgWarner Inc., Auburn Hills, MI (US)

( * ) Notice: Subject to any disclaimer, the term of this patent is extended or adjusted under 35 U.S.C. 154(b) by 285 days.

(21) Appl. No.: 13/500,938

(22) PCT Filed: Oct. 15, 2010

(86) PCT No.: PCT/US2010/052854
§ 371 (c)(1),
(2), (4) Date: Jun. 25, 2012

(87) PCT Pub. No.: WO2011/047268
PCT Pub. Date: Apr. 21, 2011

(65) Prior Publication Data
US 2012/0255714 A1    Oct. 11, 2012

Related U.S. Application Data

(60) Provisional application No. 61/252,662, filed on Oct. 17, 2009, provisional application No. 61/252,664, (Continued)

(51) Int. Cl.
*F04D 25/02* (2006.01)
*F04D 25/08* (2006.01)
(Continued)

(52) U.S. Cl.
CPC .............. *F04D 25/02* (2013.01); *F01P 7/042* (2013.01); *F01P 7/046* (2013.01); *F01P 7/048* (2013.01);
(Continued)

(58) Field of Classification Search
CPC .. F01P 7/042; F01P 7/048; F01P 7/084; F01P 7/02; F16D 35/024; F16D 35/00;
(Continued)

(56) References Cited

U.S. PATENT DOCUMENTS 2,956,450 A * 10/1960 Yule .............................. 475/31
3,120,219 A *  2/1964 Nallinger ................... 123/41.12
(Continued)

FOREIGN PATENT DOCUMENTS

CN     2359871 Y     1/2000
DE    10219872 A1 * 11/2003
(Continued)

OTHER PUBLICATIONS

Electromagnetic brakes and clutches; Elisabeth Eitel; Jun. 1, 2002; Motion System Design.*

*Primary Examiner* — Alexander Comley
(74) *Attorney, Agent, or Firm* — Harness, Dickey & Pierce, P.L.C.; John Artz, PC

(57) ABSTRACT

Thermal management systems for vehicle engines which include hybrid fan drives with viscous clutches and electronic motors, particularly brushless DC motors (BLDC). One embodiment incorporates a pulley driven, electronically controlled viscous clutch mechanism and an internal rotor BLDC motor. Another embodiment includes an engine crank mounted electronically controlled viscous clutch mechanism with a tethered electric motor, particularly a BLDC motor. A further embodiment is an engine block mounted electronically controlled viscous clutch mechanism with an integrated external rotor BLDC motor.

10 Claims, 3 Drawing Sheets

Related U.S. Application Data filed on Oct. 17, 2009, provisional application No. 61/252,665, filed on Oct. 17, 2009.

(51) Int. Cl.
*F01P 7/04* (2006.01)
*F04D 25/06* (2006.01)

(52) U.S. Cl.
CPC ......... F04D 25/0606 (2013.01); F04D 25/08 (2013.01); *H01L 2924/0002* (2013.01)

(58) Field of Classification Search
CPC ...... F16D 35/021; F16D 35/026; F04D 25/02; F04D 25/022; F04D 25/0606; F04D 25/08; F04D 13/02–13/022
USPC ............... 123/41.49, 41.12; 192/58.4, 58.63, 192/58.61, 58.1–58.684; 416/169 R, 416/169 A; 417/223, 316, 319
See application file for complete search history.

(56) References Cited

U.S. PATENT DOCUMENTS

| | | | |
|---|---|---|---|
| 3,207,279 A * | 9/1965 | Ahlen | 192/57 |
| 3,363,734 A * | 1/1968 | Sabat | 192/58.65 |
| 3,853,098 A * | 12/1974 | Ishikawa et al. | 123/41.11 |
| 3,894,521 A * | 7/1975 | Sakasegawa et al. | 123/41.12 |
| 4,094,393 A * | 6/1978 | Spokas | 192/82 T |
| 4,227,861 A * | 10/1980 | LaFlame | 416/169 A |
| 4,302,156 A * | 11/1981 | LaFlame | 416/169 A |
| 4,346,797 A | 8/1982 | Bopp | |
| 4,365,592 A * | 12/1982 | Bopp | 123/41.12 |
| 4,376,424 A * | 3/1983 | Mazur | 123/41.12 |
| 4,441,462 A * | 4/1984 | Budinski | 123/41.11 |
| 4,485,888 A * | 12/1984 | Yu | 180/297 |
| 4,846,258 A * | 7/1989 | Charles | 165/41 |
| 4,874,072 A * | 10/1989 | Mohan et al. | 192/58.61 |
| 4,899,861 A * | 2/1990 | Cummings, III | 192/85.24 |
| 5,030,865 A * | 7/1991 | Rockey et al. | 310/78 |
| 5,049,112 A * | 9/1991 | Gunsing | 474/8 |
| 5,224,446 A * | 7/1993 | Okita et al. | 123/41.12 |
| 5,557,930 A * | 9/1996 | Cakmaz et al. | 60/433 |
| 5,617,817 A * | 4/1997 | Martin | 123/41.12 |
| 5,667,045 A * | 9/1997 | Cummings, III | F01P 7/046 |
| | | | 123/41.12 |
| 5,826,549 A * | 10/1998 | Martin | F01P 5/04 |
| | | | 123/41.11 |
| 5,855,266 A * | 1/1999 | Cummings, III | 192/58.42 |
| 5,989,151 A * | 11/1999 | Kershaw et al. | 477/13 |
| 6,055,946 A * | 5/2000 | Dombek et al. | 123/41.11 |
| 6,695,113 B2 * | 2/2004 | Lutz | 192/58.61 |
| 6,752,251 B2 | 6/2004 | May et al. | |
| 6,772,714 B2 * | 8/2004 | Laird et al. | 123/41.12 |
| 6,802,283 B2 * | 10/2004 | Liederman et al. | 123/41.12 |
| 6,921,250 B2 * | 7/2005 | Boffelli | 416/155 |
| 7,011,198 B2 * | 3/2006 | Buchholz et al. | 192/58.61 |
| 7,083,032 B2 * | 8/2006 | Boyer | 192/58.61 |
| 7,178,656 B2 * | 2/2007 | Pickelman et al. | 192/103 F |
| 7,249,644 B2 | 7/2007 | Honda et al. | |
| 7,472,778 B2 * | 1/2009 | Boffelli et al. | 192/48.2 |
| 7,478,656 B2 | 1/2009 | Brient | |
| 2001/0017250 A1 * | 8/2001 | Boffelli et al. | 192/48.2 |
| 2002/0096132 A1 | 7/2002 | Stretch et al. | |
| 2003/0079952 A1 * | 5/2003 | Smith et al. | 192/21.5 |
| 2006/0137956 A1 * | 6/2006 | Boffeli et al. | 192/48.2 |
| 2010/0122673 A1 * | 5/2010 | Krafft | 123/41.49 |
| 2011/0092324 A1 | 4/2011 | Roby | |
| 2011/0123365 A1 | 5/2011 | Buchholz et al. | |
| 2012/0107145 A1 | 5/2012 | Roby | |
| 2012/0255714 A1 | 10/2012 | Roby et al. | |
| 2016/0108974 A1 | 4/2016 | Gwin | |

FOREIGN PATENT DOCUMENTS

| | | |
|---|---|---|
| JP | 2002276363 A | 9/2002 |
| JP | 2004156780 A | 6/2004 |
| KR | 100908396 B1 | 7/2009 |

* cited by examiner

HYBRID FAN DRIVE WITH ELECTRIC MOTOR

TECHNICAL FIELD

The present invention relates to hybrid drives, particularly fan drives, with a viscous clutch mechanism and an electric motor.

BACKGROUND

As government mandated fuel economy and emissions regulations continue to tighten, more pressure is being applied to vehicle manufacturers to find new technologies that increase fuel economy and minimize emissions from internal combustion engines. At the forefront of the new emissions and fuel economy technology is the electrification of the vehicle powertrain. Electricification enables sophisticated control options for powertrain components that are traditionally directly coupled to engine speed. Furthermore, hybridization is introducing new fuel conservation techniques such as start/stop technology.

These powertrain technology changes have a need for advanced thermal management systems. Engine and transmission friction, FEAD losses, engine warm-up, hot soak on shut-down, engine combustion efficiency, engine reliability, cabin comfort, battery efficiency, eMotor efficiency, inverter efficiency and many other parameters are directly or indirectly affected by the engine and powertrain thermal management. Moreover, electrification enables the adaptation of complex control systems in which individual powertrain components may be individually controlled, particularly relative to thermal management.

One of the areas in which thermal management systems can be productive relates to systems for driving cooling fans. Cooling fans have long been used in vehicle engine systems in order to pass air through a radiator in order to keep the engine coolant within acceptable temperature limits. The drives for these fans are an accessory to the engine and utilize power from the engine, thus affecting the power and gas mileage of the engine and vehicle.

It is an object of the present invention to provide an improved fan drive system which is an improvement over existing fan drive systems, particularly relative to increased fuel economy and reduction of undesirable emissions. It is also an object of the present invention to provide a hybrid fan drive system which allows operation of the fan drive both electrically and mechanically.

SUMMARY OF THE INVENTION

Preferred embodiments of the present invention comprise hybrid fan drive systems with both mechanical control and electronic control. The fan drives preferably use an electronically controlled viscous clutch mechanism for variably controlling the mechanical fan speed. The electric drive preferably operates from an electric motor, particularly a brushless DC (BLDC) motor. One embodiment of the invention incorporates a pulley driven, electronically controlled viscous clutch mechanism and an internal rotor BLDC motor. A second embodiment of the invention comprises an engine crank-mounted electronically controlled viscous clutch mechanism with a tethered BLDC motor. A third embodiment of the invention comprises an engine block-mounted electronically controlled viscous clutch mechanism with an integrated external rotor BLDC motor.

Other benefits, features and advantages of the present invention will become apparent from the following description of the preferred embodiments when considered with the attached drawings and appended claims.

DESCRIPTION OF THE PREFERRED EMBODIMENTS

Figure 1:
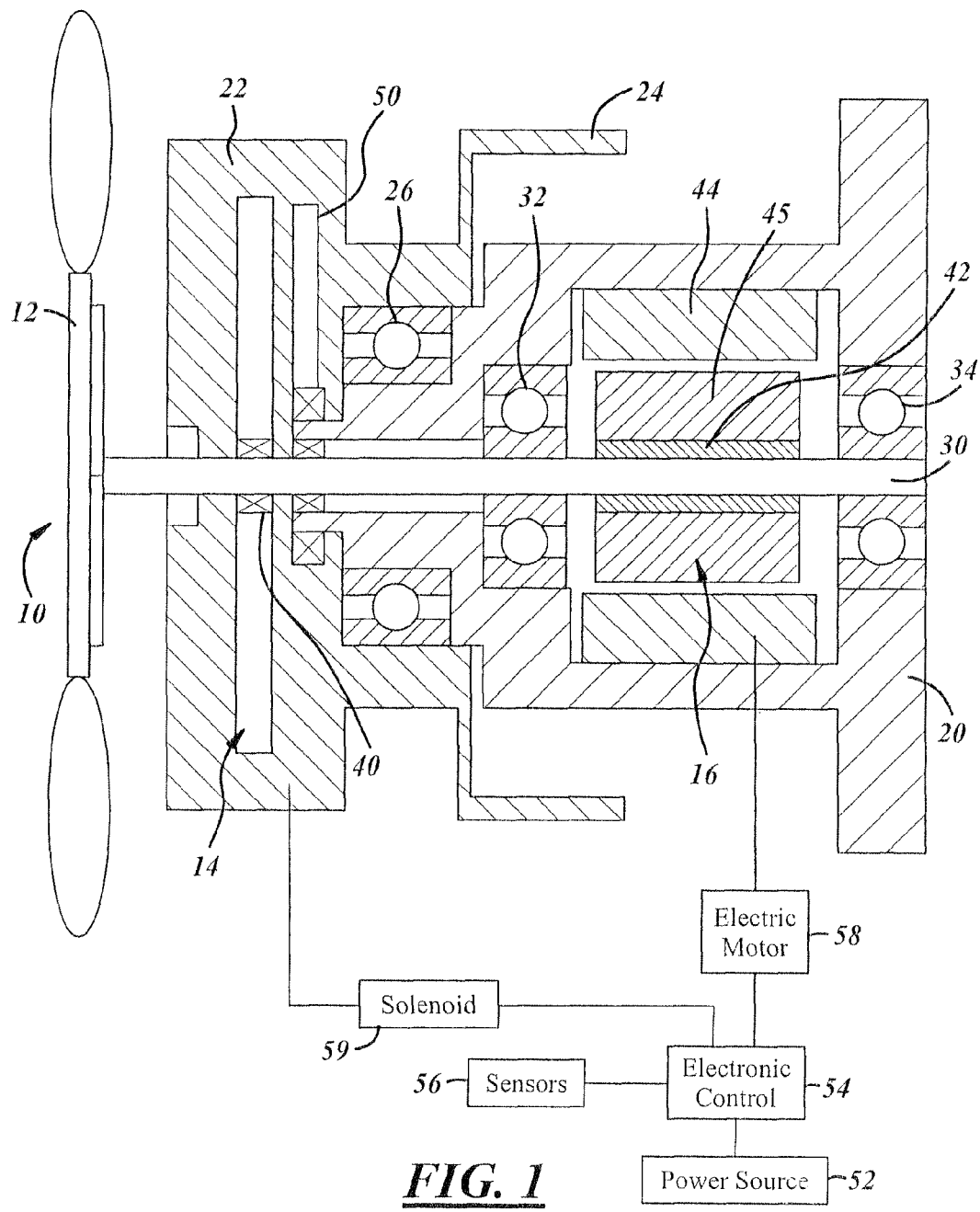
FIG. 1 illustrates an embodiment of the present invention with a pulley driven viscous clutch mechanism with a BLDC motor.

For the purpose of promoting and understanding the principles of the present invention, reference will now be made to the embodiments illustrated in the drawings and specific language will be used to describe them. It will nevertheless be understood that no limitation as to the scope of the invention is hereby intended. The invention includes any alternatives and other modifications in the illustrated devices and described methods and further applications of the principles of the invention which would normally occur to persons or ordinary skill in the art to which the invention relates.

The present invention relates generally to hybrid fan drive systems for managing thermal aspects of engines and vehicles. The fan drive systems are primarily used to maintain the temperature of the coolant within certain ranges in the vehicle engines, particularly internal combustion engines. Preferred embodiments of the invention include mechanically driven fan drive systems, combined with electric driven fan drive systems.

Although three different embodiments of the invention are described below, the invention is not to be limited to these three embodiments. Other embodiments of hybrid fan drive systems utilizing a clutch member and an electronic motor, particularly a BLDC motor, that are within the skill of persons in the art when the present embodiments are reviewed, are included within the scope of the present invention.

A first embodiment of the invention is shown in FIG. 1 and referred to generally by the reference numeral 10. This embodiment comprises a pulley driven electronic viscous clutch with an integrated brushless DC (BLDC) motor. The system 10 is used to drive a cooling fan 12. The system 10 includes a viscous clutch 14 and a BLDC motor 16, both of which are attached to or included in a mounting bracket or housing 20. The viscous clutch 14 is positioned within a viscous clutch housing 22. The housing 22 is attached to a pulley member 24 which is adapted to be attached to a serpentine accessory belt member which is typically positioned on the front of a vehicle engine. The pulley member 24 and viscous clutch housing 22 are attached through bearing 26 to the housing or bracket member 20 which is stationary. The bracket or housing 20 is typically attached to the front of the vehicle engine.

The viscous clutch housing 22 and pulley member 24 rotate at the input pulley speed. The fan member 12 is mounted on longitudinal shaft member 30 which is mounted on the bracket or housing 20 by a pair of bearings 32 and 34.

When the viscous clutch is activated, the clutch will drive the fan member 12 at the desired speed needed to maintain the coolant in the engine within an appropriate temperature range. A one-way bearing 40 is positioned around the shaft member 30 and is used to allow the viscous clutch to only rotate in one direction.

The electric motor 16 is connected to a one-way bearing 42 around the shaft member 30. The electric motor includes a stator member 44 and rotor member 45. The electric motor can be any type of electric motor, such as a stepper motor or other electric motor, but preferably is a brushless DC (BLDC) motor.

One-way bearings 40 and 42 can be of any type of conventional one-way bearings, such as sprag-type bearings or roller-type bearings.

The viscous clutch member, often called an eViscous clutch, can be any of the known electronic viscous clutch mechanisms known today. For example, the viscous clutch mechanisms could be those shown in U.S. Pat. Nos. 7,083,032, 7,178,656 or 7,249,644.

Electric power to the viscous clutch and electric motor are provided by power source 52. The operation of the clutch and motor are controlled by the electronic control 54 of the vehicle. Sensors 56 provide input to the electronic control. The sensors typically input the temperature of the coolant in the engine. The electronic control 54 sends electric signals to the electric motor 58 to control its operation, and to the solenoid 59 which controls the operation of the viscous clutch.

As indicated, one-way clutches/bearings are used to connect the BLDC rotor and the viscous clutch rotor to the main shaft 30 to which the fan mounts. This enables a fan shaft to over-run the viscous clutch rotor when driven electrically, and likewise to over run the BLDC rotor when driven mechanically.

The viscous clutch coupling is preferably one commonly used for vehicle cooling fans in which torque is transferred from the input member to the output member through the shearing of a viscous fluid in an interleaved labyrinth area. The amount of clutch engagement is electronically controlled by regulating the amount of viscous fluid in the shearing area. Electronic fluid regulation is achieved through any one of the methods currently employed in known viscous fan drives, but would preferably be controlled using a variable fluid friction feed pump technology.

A preferred variable fluid friction feed pump system uses a pitot type of fluid pump to move fluid from the reservoir to the labyrinth area. These are described, for example, in U.S. Pat. Nos. 7,178,656 and 7,249,644. The amount of fluid pumped is controlled by regulating the differential speed between the spinning reservoir and the pitot tube 50, which in turn controls the velocity pressure of the fluid in front of the pitot pump. The differential speed between the reservoir and pump is controlled electronically with an integrated eddy current brake device. This pump design also provides a more stable open loop control than traditional electronic viscous control methods. This enables the device to achieve better fan speed control performance than traditional electronic viscous fan drives.

Figure 2:
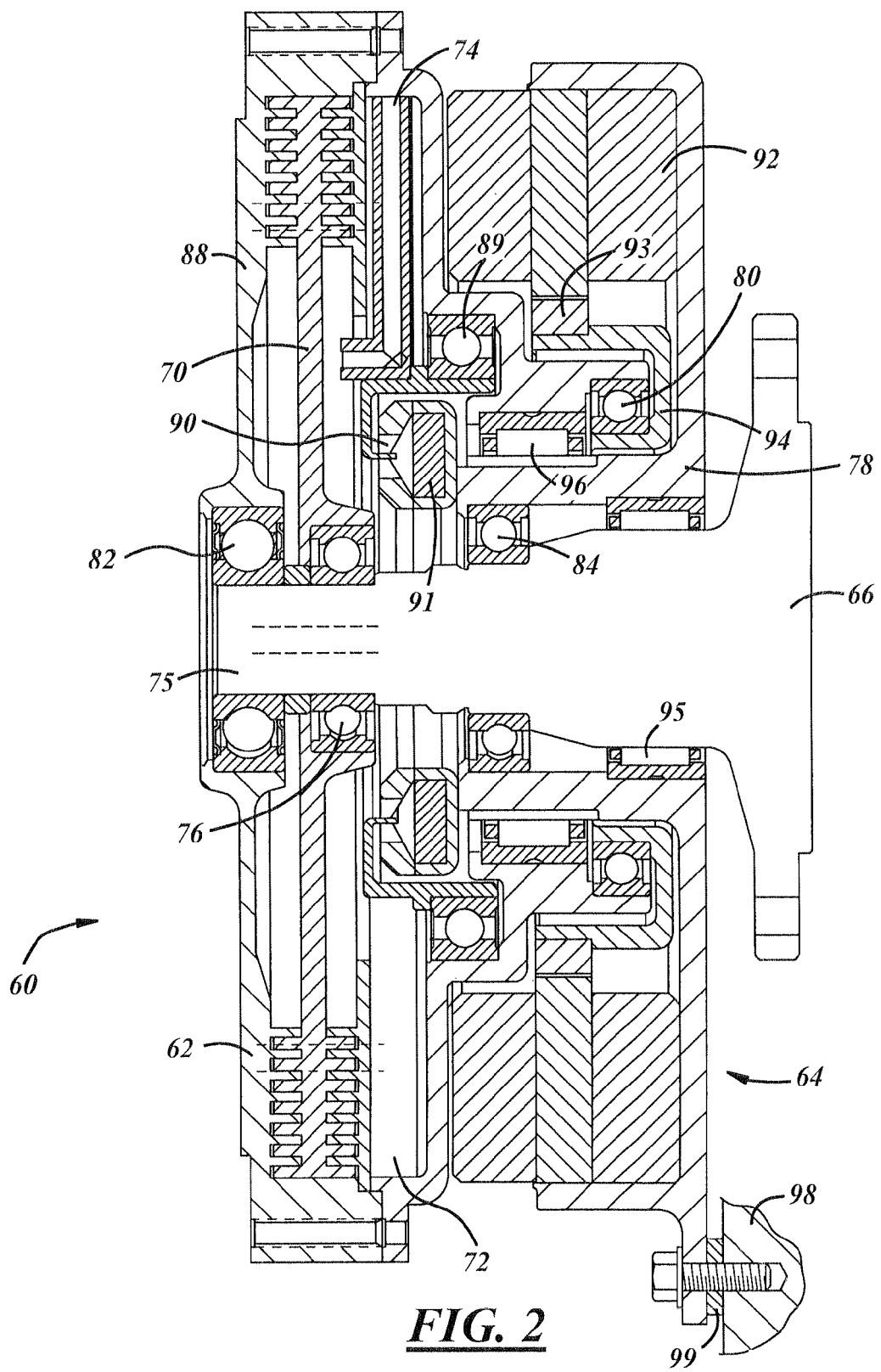
FIG. 2 illustrates an embodiment of the present invention with a crank-mounted viscous clutch mechanism with a BLDC motor.

FIG. 2 illustrates a second embodiment of a hybrid fan drive system in accordance with the present invention. This embodiment includes an engine crank-mounted electronically controlled viscous clutch mechanism with a tethered BLDC motor and is identified generally by the reference numeral 60 in FIG. 2. This embodiment is similar to the embodiment discussed above with reference to FIG. 1, in that it has two basic drive modes with the first drive mode being a mechanical drive achieved using an electronically controlled viscous fluid coupling, and a second drive mode being a direct electric drive via an electric motor, particularly a BLDC motor. The main difference between the two embodiments is that the embodiment 60 shown in FIG. 2 is configured for crank mount applications.

Again, like the embodiment described above in FIG. 1, the embodiment 60 shown in FIG. 2 includes a viscous drive mechanism 62 and an electric motor mechanism 64, both of which are mounted on a central shaft 66 attached to the engine crankshaft. A cooling fan (not shown) is mounted on the front (i.e. on the left side of the embodiment shown in FIG. 2) in order to cool coolant in the radiator.

The viscous clutch mechanism 62 has a rotor member 70, a viscous fluid reservoir 72, and a differential speed variable fluid friction pitot pump 74. The viscous clutch rotor member 70 is mounted on the central shaft 66 by one-way bearing 76. The electric motor stator 92 and rotor 93 are positioned in a rotor carrier or support 94. Similarly, the electric motor 64 is mounted on stationary housing 78. Additional conventional bearing members 82 and 84 are used to mount the entire mechanism on the mounting member or bracket 66. Needle bearings 95 and 96 are used to assist in allowing the components to rotate relative to one another.

The one-way bearings and electronic power supply and control systems preferably are the same as that disclosed above with reference to FIG. 1.

In this embodiment, the shaft member 66 is attached directly to the engine crankshaft or an engine driven pulley. In the mechanical drive mode, torque from the input shaft is transferred through the one way bearing 76 to the viscous clutch plate and subsequently to the output housing 88 through the shearing of a viscous fluid in the labyrinth area. The fan is mounted directly to the output housing as mentioned above.

Variable speed control for the viscous clutch is achieved by controlling the amount of fluid in the labyrinth area. This is common in known viscous clutches today. The feed pump rate is controlled by electronically varying the differential speed between the fluid reservoir and the feed pump pitot tube 74.

The embodiment shown in FIG. 2 also includes a hysteresis break 90 for controlling the differential speed between the fluid reservoir and the feed pump pitot. The pitot tube rotates around bearing 89. A coil 91 is used to add drag to the pitot tube. The hysteresis break uses the coil to generate a magnetic field that is concentrated in toothed slots through which a drag cup passes which is attached to the feed pump pitot. As the drag cup spins, the magnetic poles induce eddy currents in the cup which create magnetic fields that oppose the rotation to create a drag torque that is proportional to the current applied to the coil. With no power, the rotor 70 spins at fan speed. When power is added to the coil in the hysteresis break 90, it adds drag to the pitot tube and the differential speed between the pitot tube and the fan. This allows fluid to be pumped to the pitot tube into the working chamber.

The motor housing 78 is tethered 98 to the engine so it does not spin in a manner that is similar to most electronically controlled viscous fan drives. The tether 98 is compliant with, for example, a rubber washer member 99. When the device operates in electric drive mode, the electronic motor, preferably a BLDC motor, turns the rotor 92 which then transfers torque through the one way bearing 80 to the clutch housing.

The hysteresis break 90 used to control the differential speed of the feed pump does not require permanent magnets. This makes the system less expensive to manufacture.

Since the fluid reservoir and the viscous clutch are attached to the output member, there may not be sufficient differential speed available at low fan speeds to pump the fluid through the feed pump and engage the drive. In such situations, the BLDC motor is used to spin the output housing up to a speed at which the feed pump is able to operate efficiently.

The tether 98 counteracts the fan torque during the electric drive mode. The tether also can be utilized to carry the power wires to the BLDC motor, the feed pump brake coil, and the sensors.

Figure 3:
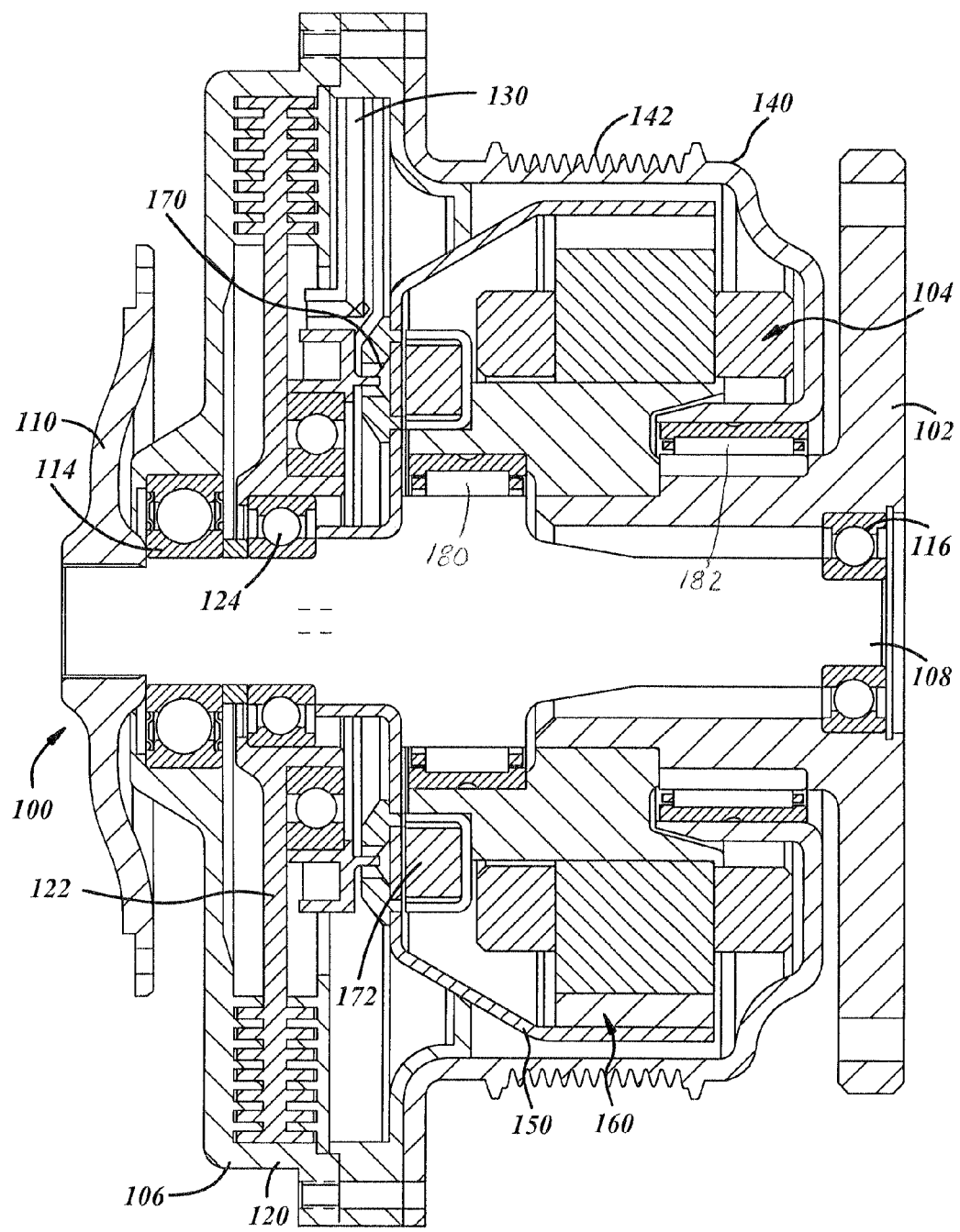
FIG. 3 illustrates embodiment of the present invention with a pulley-driven viscous clutch with an external rotor BLDC motor.

A third embodiment of the present invention is shown in FIG. 3 and indicated generally by the reference number 100. This embodiment is an engine block mounted electronically controlled viscous clutch mechanism with an integrated external rotor BLDC motor.

This system 100 includes a stationary mounting bracket 102, an external rotor BLDC motor 104, a viscous clutch mechanism 106 and a central shaft member 108. A fan adapter member 110 is mounted to the end of the shaft member 108. The viscous clutch mechanism includes a housing 120 and an internal rotor 122. The rotor 122 is attached to the shaft member 108 by a one-way bearing 124. The viscous clutch mechanism 106 also has a differential speed pitot pump 130. The external housing 120 includes a pulley section 140 that has a pulley member 142 incorporated in it for attachment to the serpentine belt member for the engine. A "cup" housing member 150 is positioned around the external rotor BLDC motor 104. The rotor 160 of the external rotor BLDC motor 104 includes a rotor 160 that is positioned inside the "cup" housing member 150. The external rotor BLDC motor 104 also has a stator which is separated from the rotor by an air gap.

This third embodiment also contains a hysteresis break 170 along with hysteresis break coil 172. Conventional bearing members 114 and 116 are used to mount the components on the central shaft member 108. Needle bearings 180, 182 are also utilized to support the shaft and the pulley. The one-way bearings, power supply and electronic control are preferably similar to the embodiments discussed above with respect to FIGS. 1 and 2.

Like the first two embodiments discussed above, the embodiment shown in FIG. 3 has two distinct operating modes. In the mechanical operating mode, the pulley member is driven by the FEAD and transfers torque to the viscous clutch housing. The torque is then selectively transferred to the clutch through viscous shear in the labyrinth area. The clutch torque is transferred to the output shaft through a one-way bearing. In the same manner as set forth above relative to the embodiment shown in FIG. 2, variable speed control of the viscous clutch is achieved through the pitot pump and hysteresis break. In an electrically operating mode, the external rotor BLDC motor transfers torque directly to the output shaft.

The rotor carrying cup is made from a non-magnetic material, such as stainless steel, so that the magnetic flux generated by the coil is directed through the rotor carrying cup via the hysteresis break poles to complete the magnetic circuit.

In an alternate embodiment to the embodiment shown in FIG. 3, the hysteresis break is eliminated and the feed pump pitot is attached directly to the rotor carrying cup via a one-way bearing. The BLDC motor is used to provide the breaking torque required to generate the differential speed needed by the feed pump to regulate the fluid fill for the viscous clutch. This alternative also requires the addition of high power breaking resistors in the controller.

Although the invention has been described with respect to preferred embodiments, it is to be also understood that it is not to be so limited since changes and modifications can be made therein which are within the full scope of this invention as detailed by the following claims.

What is claimed is:

1. A hybrid drive comprising:
   an input shaft that is rotatable about an axis, the input shaft having a pair of opposite ends;
   an electric motor having a rotor that is disposed between the opposite ends of the input shaft;
   a viscous clutch having an output housing, a clutch disk, a feed pump, a feed pump bearing and a hysteresis brake, the clutch disk being rotatably received in the output housing and being configured to receive rotary power from the input shaft, the feed pump bearing being directly coupled to the feed pump and the output housing such that the feed pump is rotatable relative to the output housing about the axis, wherein the feed pump is rotatable relative to the clutch disk, the hysteresis brake having an electromagnet and a drag cup that is coupled to the feed pump for rotation therewith;
   a first overrunning clutch coupling the rotor to the output housing and being operable in a first mode, in which the output housing is drivingly coupled to the rotor for rotation in a first rotary direction, and a second mode in which the output housing is capable of overrunning the rotor in the first rotary direction; and
   a second overrunning clutch coupling the clutch disk to the input shaft, the second overrunning clutch being operable in a third mode, in which the clutch disk is drivingly coupled to the input shaft for rotation in the first rotary direction, and a fourth mode in which the clutch disk overruns the input shaft in the first rotary direction.

2. The hybrid drive of claim 1, wherein the second overrunning clutch comprises a bearing.

3. The hybrid drive of claim 1, wherein the first overrunning clutch comprises a bearing.

4. The hybrid drive of claim 1, wherein the electric motor is a brushless DC electric motor.

5. The hybrid drive of claim 1, further comprising a fan coupled to the output housing for rotation therewith.

6. A hybrid drive comprising:
   an input shaft that is rotatable about an axis, the input shaft having a pair of opposite ends;
   an electric motor having a rotor that is disposed between the opposite ends of the input shaft;
   a viscous clutch having an output housing, a clutch disk, a feed pump and a feed pump bearing, the clutch disk being rotatably received in the output housing and being configured to receive rotary power from the input shaft, the feed pump bearing being directly coupled to the feed pump and the output housing such that the feed pump is rotatable relative to the output housing about the axis, wherein the feed pump is rotatable relative to the clutch disk;
   a first overrunning clutch coupling the rotor to the output housing and being operable in a first mode, in which the output housing is drivingly coupled to the rotor for rotation in a first rotary direction, and a second mode in which the output housing is capable of overrunning the rotor in the first rotary direction; and a second overrunning clutch coupling the clutch disk to the input shaft, the second overrunning clutch being operable in a third mode, in which the clutch disk is drivingly coupled to the input shaft for rotation in the first rotary direction, and a fourth mode in which the clutch disk overruns the input shaft in the first rotary direction.

7. The hybrid drive of claim 6, wherein the second overrunning clutch comprises a bearing.

8. The hybrid drive of claim 6, wherein the first overrunning clutch comprises a bearing.

9. The hybrid drive of claim 6, wherein the electric motor is a brushless DC electric motor.

10. The hybrid drive of claim 6, further comprising a fan coupled to the output housing for rotation therewith.

* * * * *